(12) United States Patent
Shinada et al.

(10) Patent No.: US 11,823,879 B2
(45) Date of Patent: Nov. 21, 2023

(54) FILM FORMATION APPARATUS AND FILM FORMATION METHOD

(71) Applicant: TOKYO ELECTRON LIMITED, Tokyo (JP)

(72) Inventors: Masato Shinada, Tokyo (JP); Tetsuya Miyashita, Yamanashi (JP); Naoki Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/573,368

(22) Filed: Jan. 11, 2022

(65) Prior Publication Data
US 2022/0223390 A1 Jul. 14, 2022

(30) Foreign Application Priority Data

Jan. 14, 2021 (JP) .................. 2021-004131

(51) Int. Cl.
*H01J 37/34* (2006.01)
*C23C 14/34* (2006.01)

(52) U.S. Cl.
CPC ...... *H01J 37/3429* (2013.01); *C23C 14/3464* (2013.01); *H01J 37/3435* (2013.01); *H01J 37/3441* (2013.01); *H01J 37/3447* (2013.01); *H01J 2237/332* (2013.01)

(58) Field of Classification Search
CPC .............. H01J 37/3429; H01J 37/3435; H01J 37/3441; H01J 37/3447; H01J 2237/332; C23C 14/3464; C23C 14/564
See application file for complete search history.

(56) References Cited

U.S. PATENT DOCUMENTS

| | | | | | |
|---|---|---|---|---|---|
| 6,143,149 | A | * | 11/2000 | Abe | ............... C23C 14/3464 204/298.18 |
| 2003/0085122 | A1 | * | 5/2003 | Takahashi | ......... H01J 37/3435 204/298.23 |
| 2007/0056845 | A1 | * | 3/2007 | Ye | ................ H01J 37/3441 204/192.1 |
| 2012/0055787 | A1 | * | 3/2012 | Ohba | ............... C23C 14/3414 204/298.12 |
| 2012/0164354 | A1 | * | 6/2012 | Otani | .................. C23C 14/352 427/580 |
| 2013/0270104 | A1 | * | 10/2013 | Yang | ................... C23C 14/352 204/192.1 |
| 2014/0102889 | A1 | * | 4/2014 | Kajihara | ............. H01J 37/3447 204/298.11 |
| 2015/0114835 | A1 | * | 4/2015 | Gomi | .................. H01J 37/3447 204/298.08 |

FOREIGN PATENT DOCUMENTS

JP 2019-004075 A 1/2019

* cited by examiner

*Primary Examiner* — Jennifer Wecker
*Assistant Examiner* — Patrick S Ott
(74) *Attorney, Agent, or Firm* — Fenwick & West LLP

(57) ABSTRACT

There is provided a film formation apparatus which forms a film on a substrate by sputtering. The apparatus comprises: a substrate holder configured to hold the substrate; and a plurality of cathodes configured to hold targets that emit sputtered particles, and connected to a power supply. At least one of the plurality of cathodes holds the targets of a plurality of types.

7 Claims, 7 Drawing Sheets

FILM FORMATION APPARATUS AND FILM FORMATION METHOD

CROSS-REFERENCE TO RELATED APPLICATIONS

This application claims priority to Japanese Patent Application No. 2021-004131 filed on Jan. 14, 2021, the entire contents of which are incorporated herein by reference.

TECHNICAL FIELD

The present disclosure relates to a film formation apparatus and a film formation method.

BACKGROUND

A film formation apparatus disclosed in Japanese Laid-open Patent Publication No. 2019-004075 includes a processing container, and a stage is installed in the processing container. The stage includes an electrostatic chuck on which a wafer is mounted. In addition, a plurality of (three or more) targets are installed above the stage. The plurality of targets have metallic materials which are different from one another. Also, each of the plurality of targets is held by a holder made of a metal. The holder is supported on a ceiling portion of the processing container via an insulating member. A power supply is connected to each of the plurality of targets via the holder. The power supply applies a negative direct current (DC) voltage to each of the plurality of targets. Further, a plurality of magnets are disposed outside the processing container so as to face the corresponding targets. The film formation apparatus includes a plurality of scanning mechanisms for operating the plurality of magnets respectively.

SUMMARY

The technique according to the present disclosure makes it possible to mount a wider variety of targets in a film formation apparatus which forms a film on a substrate by sputtering without changing a size of a cathode and without increasing a size of the apparatus.

In accordance with an aspect of the present disclosure, there is provided a film formation apparatus which forms a film on a substrate by sputtering. The apparatus comprises: a substrate holder configured to hold the substrate; and a plurality of cathodes configured to hold targets that emit sputtered particles, and connected to a power supply. At least one of the plurality of cathodes holds the targets of a plurality of types.

DETAILED DESCRIPTION

Figure 1:
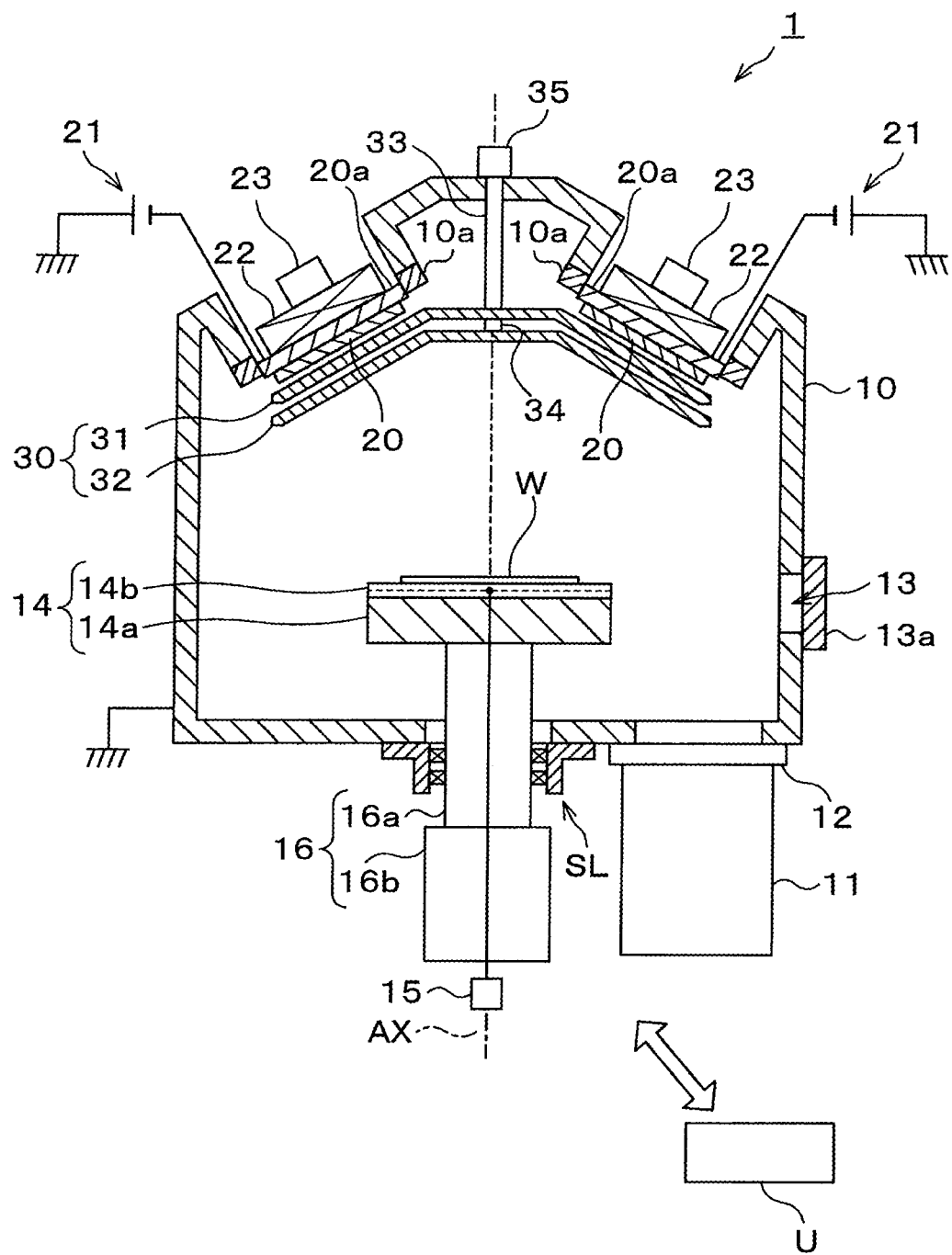
FIG. 1 is a longitudinal cross-sectional view illustrating an outline of a configuration of a film formation apparatus according to an embodiment.

In a manufacturing process of a semiconductor device or the like, a film forming process for forming a desired film such as a metal film is performed on a substrate such as a semiconductor wafer (hereinafter, referred to as a "wafer"). This film forming process is performed by, for example, sputtering.

The film formation apparatus for forming a film by sputtering includes a substrate holder which holds the substrate, and a cathode which holds a target that emits sputtered particles so that it faces the substrate holder, and is connected to a power supply. The cathode is supported, for example, on a ceiling portion of a processing container in which the substrate holder is installed.

A plurality of targets may be mounted in the film formation apparatus. For example, when a multilayer film having different compositions between layers is formed by one film formation apparatus, the plurality of targets are mounted. When the plurality of targets are mounted, the targets are held on different cathodes respectively (refer to Japanese Laid-open Patent Publication No. 2019-004075).

Further, in recent years, mounting more types of targets in the film formation apparatus may be required due to further multi-layering of the multilayer film and the like. However, when the number of cathodes is increased in order to increase the number of targets mounted in the film formation apparatus, the processing container which supports the cathodes becomes large, and the size of the film formation apparatus increases. When a design of the cathode is changed to make the cathode smaller, it is possible to suppress the increase in the size of the film formation apparatus when the number of cathodes is increased, but when the design of the cathode is changed, a state of emission of the sputtered particles into a processing space during sputtering changes, and thus it is necessary to review processing conditions, which is not preferable.

Therefore, the technology according to the present disclosure makes it possible to mount a wider variety of targets in the film formation apparatus which forms a film on the substrate by sputtering without changing a size of the cathode and without increasing a size of the apparatus.

Hereinafter, the film formation apparatus according to the present embodiment will be described with reference to the accompanying drawings. In the present specification and the drawings, elements having substantially the same functional configuration are designated by the same reference numerals, and duplicate description thereof will be omitted.

<Film Formation Apparatus>

Figure 2:
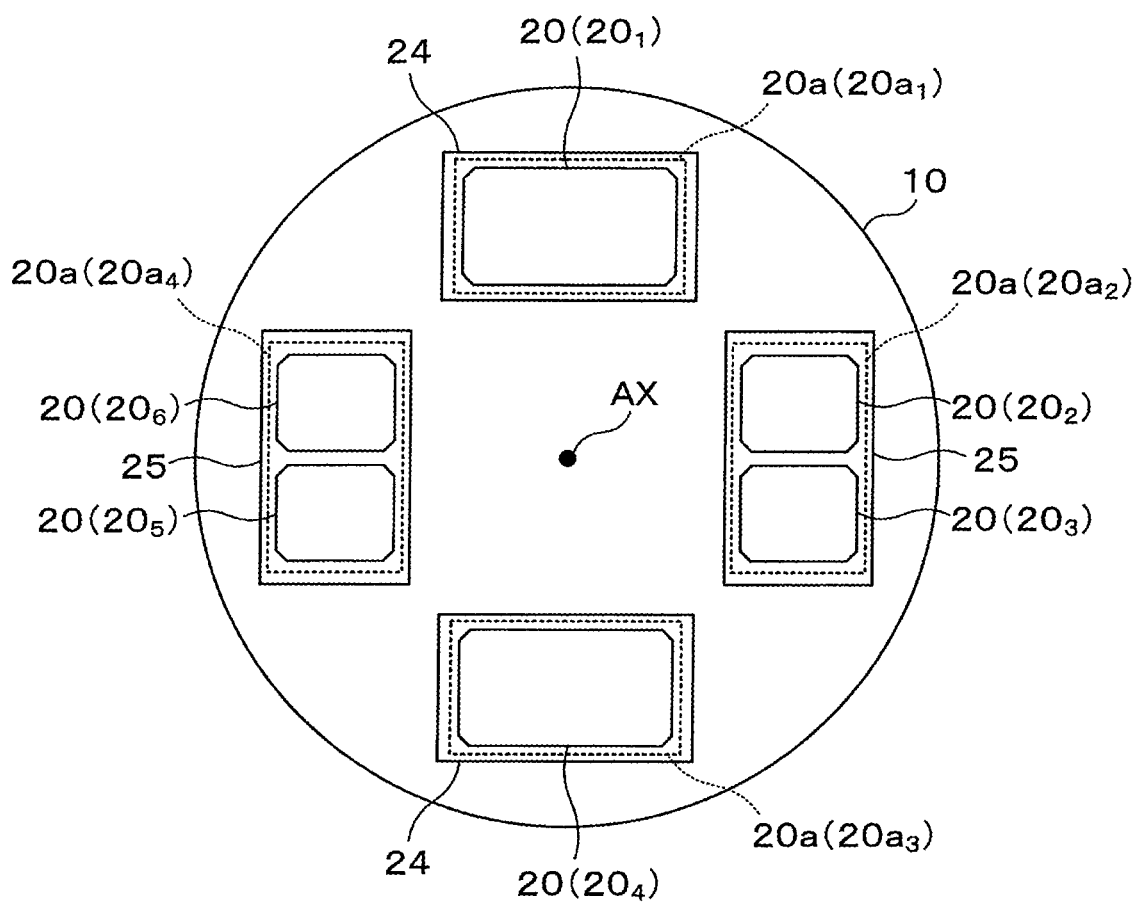
FIG. 2 is a schematic bottom view of a ceiling portion of a processing container.
Figure 3:
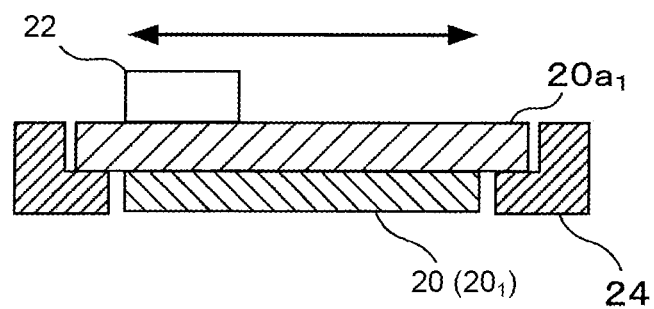
FIG. 3 is a diagram for describing a configuration around a first cathode.
Figure 4:
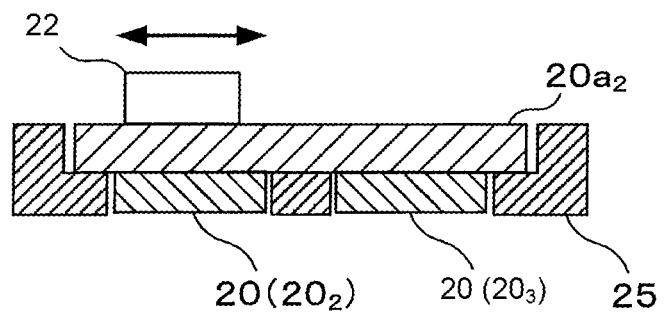
FIG. 4 is a diagram for describing a configuration around a second cathode.
Figure 5:
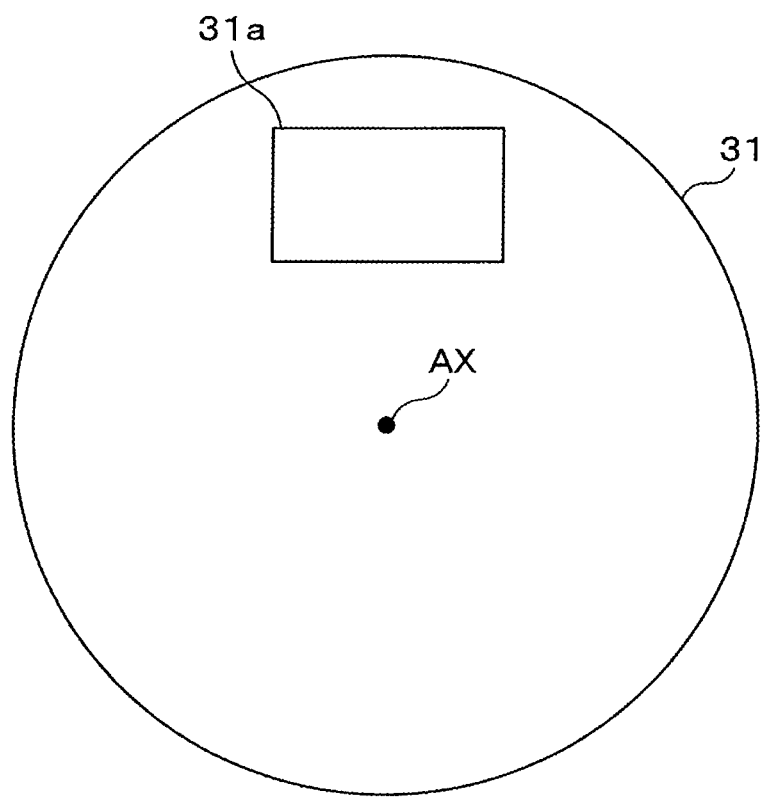
FIG. 5 is a schematic bottom view of a first shutter.
Figure 6:
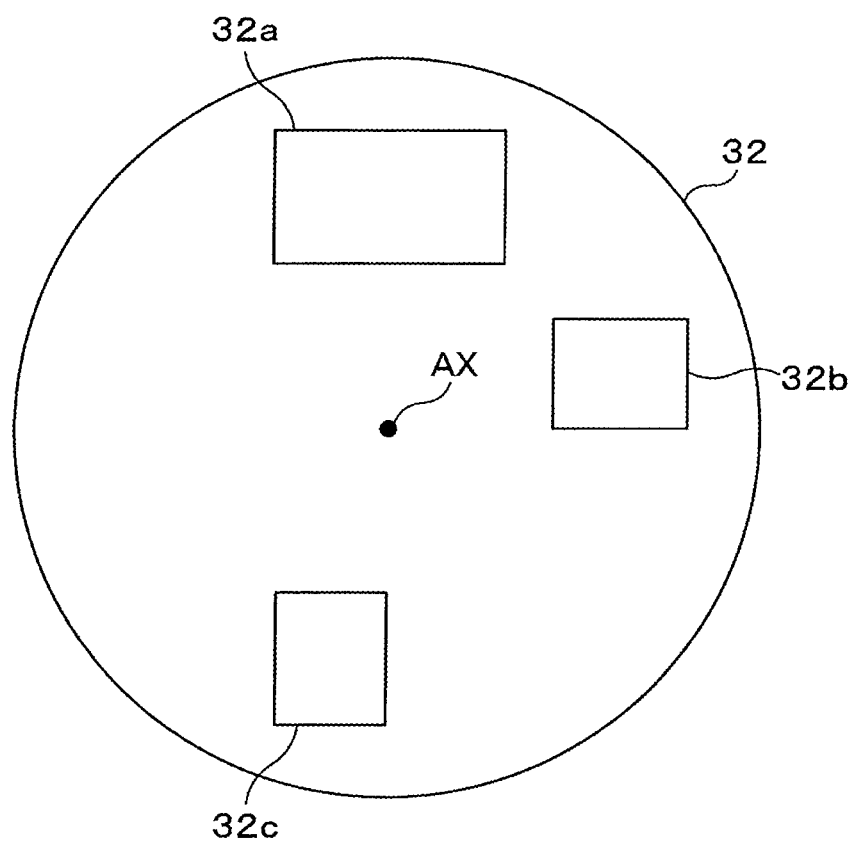
FIG. 6 is a schematic bottom view of a second shutter.
Figure 7:
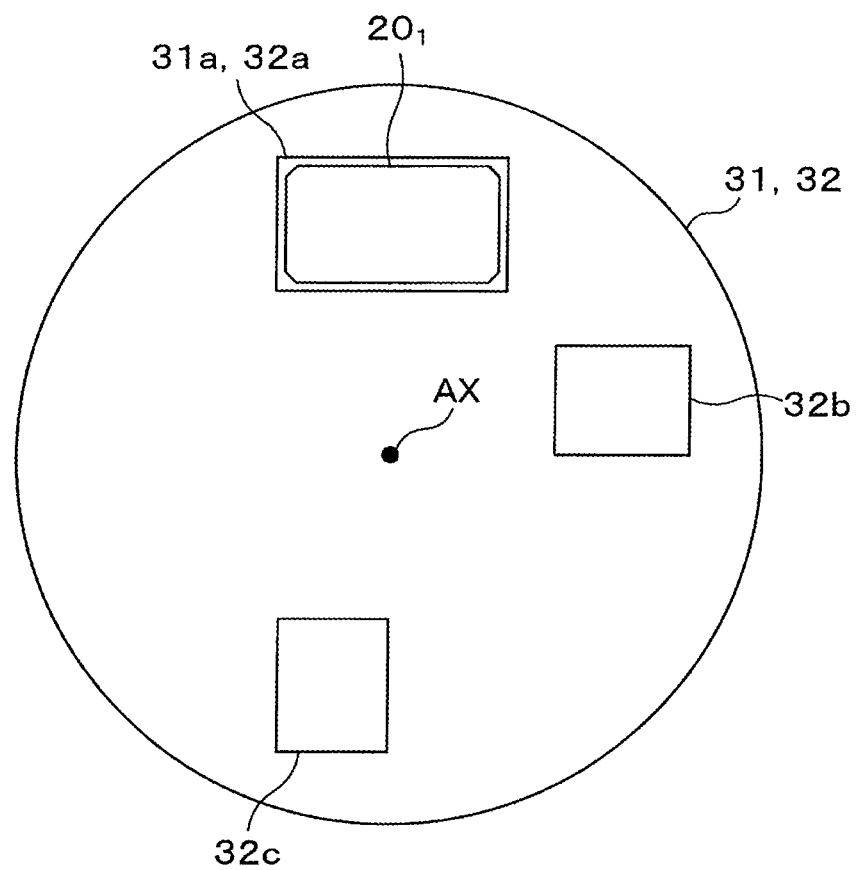
FIG. 7 is a diagram illustrating a state in which one target is selectively exposed by the first shutter and the second shutter.
Figure 8:
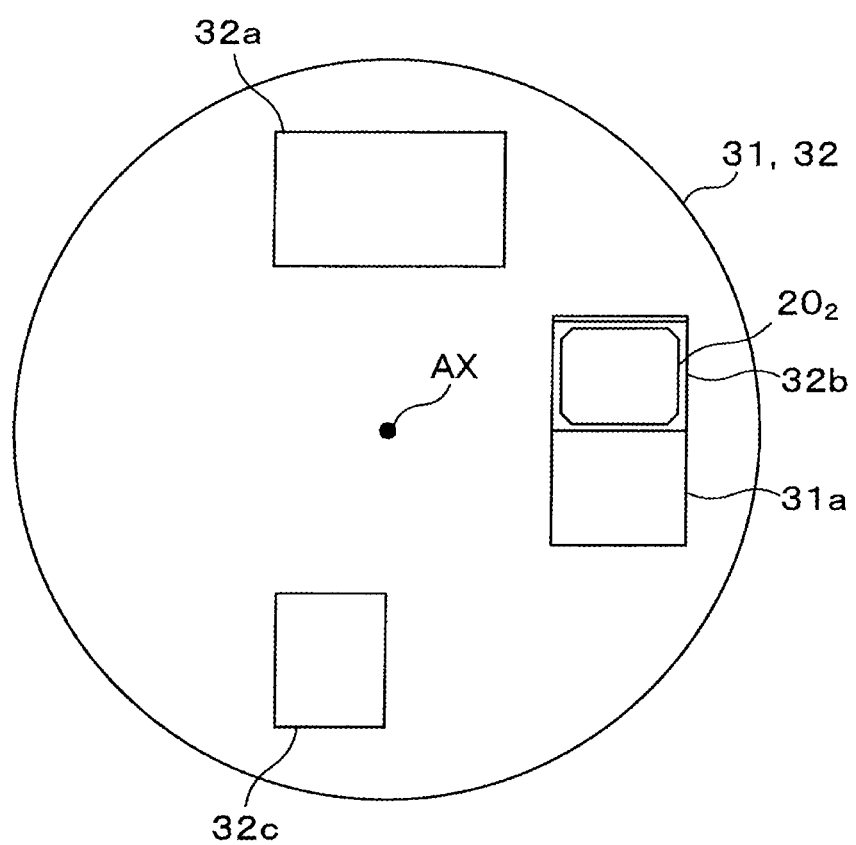
FIG. 8 is a diagram illustrating the state in which one target is selectively exposed by the first shutter and the second shutter.
Figure 9:
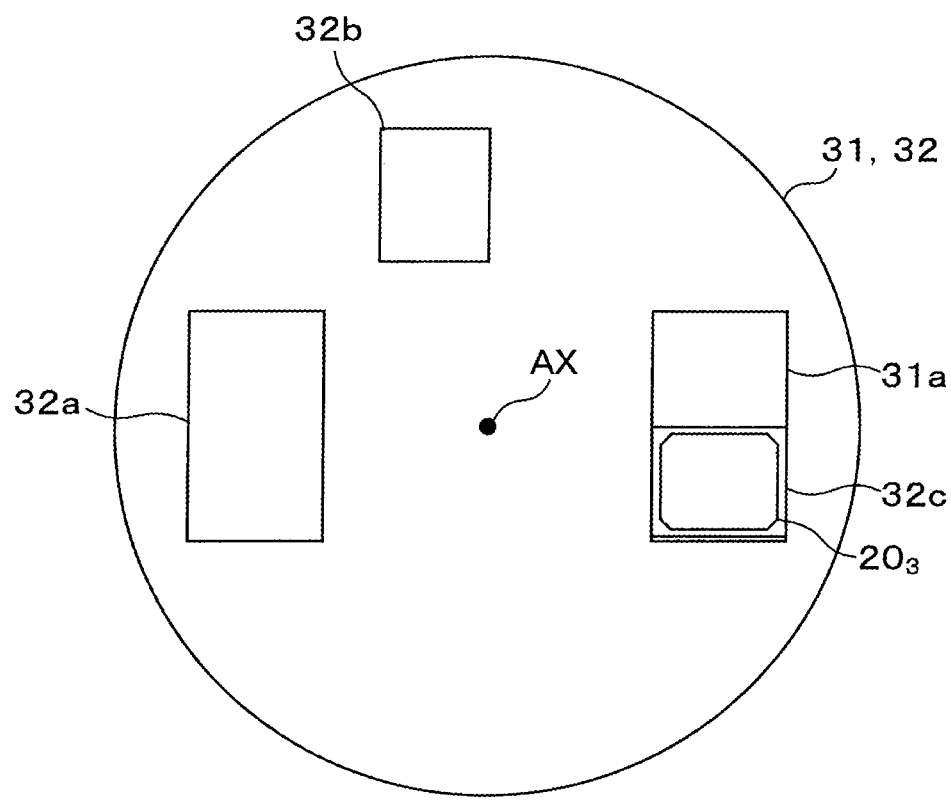
FIG. 9 is a diagram illustrating the state in which one target is selectively exposed by the first shutter and the second shutter.

FIG. 1 is a longitudinal cross-sectional view illustrating an outline of a configuration of the film formation apparatus 1 according to the present embodiment. FIG. 2 is a schematic bottom view of a ceiling portion of the processing container 10 which will be described below. FIG. 3 is a diagram for describing a configuration around a first cathode which will be described below. FIG. 4 is a diagram for describing a configuration around a second cathode which will be described below. FIG. 5 is a schematic bottom view of a first shutter which will be described below. FIG. 6 is a schematic bottom view of a second shutter which will be described below. FIGS. 7 to 9 are diagrams illustrating a state in which one target is selectively exposed by the first shutter and the second shutter. In FIG. 1, illustration of a shield which will be described below is omitted.

The film formation apparatus 1 in FIG. 1 forms a film on a wafer W as the substrate by sputtering and, more specifically, forms a multilayer film on the wafer W by magnetron sputtering. The film formation apparatus 1 includes a processing container 10.

The processing container 10 is configured to be depressurizable and accommodates the wafer W. The processing container 10 is made of, for example, aluminum and is connected to a ground potential. An exhaust device 11 for reducing a pressure in a space inside the processing container 10 is connected to a bottom portion of the processing container 10 via an adaptive pressure control (APC) valve 12. Further, a loading and unloading port 13 of the wafer W is formed on a side wall of the processing container 10, and a gate valve 13a for opening and closing the loading and unloading port 13 is installed at the loading and unloading port 13.

A mounting table 14 as the substrate holder is installed in the processing container 10. The wafer W is mounted on the mounting table 14. The mounting table 14 has a base 14a and an electrostatic chuck 14b.

The base 14a is formed in a disk shape using, for example, aluminum. A heater (not shown) for heating the wafer W is installed on the base 14a. A cooling mechanism may be installed instead of the heater, or both the heater and the cooling mechanism may be installed.

The electrostatic chuck 14b includes a dielectric film and an electrode installed as an inner layer of the dielectric film and is installed on the base 14a. A direct current (DC) power supply 15 is connected to the electrode of the electrostatic chuck 14b. The wafer W mounted on the electrostatic chuck 14b is attracted and held by the electrostatic chuck 14b by an electrostatic force generated by applying a DC voltage from the DC power supply 15 to the electrode.

The mounting table 14 is connected to a rotating and moving mechanism 16. The rotating and moving mechanism 16 includes, for example, a support shaft 16a and a driving part 16b.

The support shaft 16a extends in a vertical direction to pass through a bottom wall of the processing container 10. A sealing member SL is installed between the support shaft 16a and the bottom wall of the processing container 10. The sealing member SL is a member which seals a space between the bottom wall of the processing container 10 and the support shaft 16a so that the support shaft 16a can rotate and move up and down and is, for example, a magnetic fluid seal. An upper end of the support shaft 16a is connected to a center of a lower surface of the mounting table 14, and a lower end thereof is connected to the driving part 16b.

The driving part 16b has a driving source (for example, a motor or the like) which generates a driving force for rotating and moving the support shaft 16a up and down. As the support shaft 16a rotates around an axis AX thereof, the mounting table 14 rotates around the axis AX, and as the support shaft 16a moves up and down, the mounting table 14 moves up and down.

A plurality of cathodes 20a, made of a metal such as copper, which hold the targets 20 are installed above the mounting table 14, and in this example, four cathodes 20 are installed. Each of the cathodes 20a holds the target 20 at the front so that the target 20 is disposed in the processing container 10 and faces the mounting table 14. Each of the cathodes 20a is installed on a ceiling portion of the processing container 10. A through hole is formed at an installation position of each of the cathodes 20a in the processing container 10. Further, an insulating member 10a is installed on an inner wall surface of the processing container 10 to surround the through hole. Each of the cathodes 20a is installed in the processing container 10 via the insulating member 10a to close the through hole.

Further, a power supply 21 is connected to each of the cathodes 20a, and a negative DC voltage is applied from the power supply 21. An AC voltage may be applied instead of the negative DC voltage.

Further, a magnet 22 is installed at a position on the rear side of each of the cathodes 20a and outside the processing container 10. The magnet 22 is connected to a moving mechanism 23 and swings in a predetermined direction along a rear surface of the corresponding cathode 20a by the moving mechanism 23. The predetermined direction is, for example, a tangential direction of a circle centered on the axis AX at a center point of the corresponding cathode 20a. The moving mechanism 23 includes a driving part (not shown) including a driving source (for example, a motor or the like) which generates a driving force for swinging the magnet 22.

In this example, the number of cathodes 20a is four as described above. As shown in FIG. 2, the four cathodes 20a are arranged at equal intervals along a circumference centered on the axis AX. In the following, as described above, each of the cathodes 20a arranged at equal intervals along the circumference may be referred to as a first cathode $20a1$, a second cathode $20a2$, a third cathode $20a3$, and a fourth cathode $20a4$ in a clockwise direction in order from the upper cathode in FIG. 2.

In the present embodiment, at least one of the four cathodes 20a can hold a plurality of types of targets 20 at the same time.

For example, as shown in FIGS. 2 and 3, one large target 20 is held on each of the first and third cathodes $20a_1$ and $20a_3$, and as shown in FIGS. 2 and 4, two small targets 20 are held on each of the second and fourth cathodes $20a_2$ and $20a_4$ so as to be aligned in a swinging direction of the magnet 22.

In the following, the target 20 held by the first cathode $20a_1$ may be referred to as a first target $20_1$, the target 20 of the two targets 20 held by the second cathode $20a_2$ on the positive side in a circumferential direction with respect to the axis AX when viewed from the mounting table 14 side may be referred to as a second target $20_2$, and the target 20 on the negative side in the same direction may be referred to as a third target $20_3$. Similarly, the target 20 held by the third cathode $20a_3$ may be referred to as a fourth target $20_4$, the target 20 of the two targets 20 held by the fourth cathode $20a_4$ on the positive side in the circumferential direction when viewed from the mounting table 14 side may be referred to as a fifth target $20_5$, and the target 20 on the negative side in the same direction may be referred to as a sixth target $20_6$.

The first to sixth targets $20_1$ to $20_6$ are made of different types of materials.

Further, a shield 24 is installed on the first cathode $20a1$ in order to prevent contamination (cross-contamination) between the single target 20 held by the first cathode $20a_1$ and the targets 20 held by the other cathodes 20a. The shield 24 is installed to cover an outer periphery of the target 20 held by the first cathode $20a_1$. A similar shield 24 is installed on the third cathode $20a_3$.

A shield 25 is installed on the second cathode $20a_2$ which holds the two targets 20 in order to prevent contamination between the two targets 20 held by the second cathode $20a_2$ and between the targets 20 held by the second cathode $20a_2$ and the targets 20 held by the other cathodes $20a$. The shield 25 is installed to cover the entire outer periphery of the plurality of targets 20 held by the second cathode $20a_2$ and to separate the two targets 20 held by the second cathode $20a_2$ from each other. A similar shield 25 is installed on the fourth cathode $20a_4$.

The shields 24 and 25 can prevent the cathode $20a$ from being sputtered. Further, the shields 24 and 25 are formed of, for example, aluminum.

An end surface (a lower surface in the drawing) of each of the shields 24 and 25 on the mounting table 14 side and an end surface (a lower surface in the drawing) of the corresponding target 20 in an unused state on the mounting table 14 side are located (located below in the drawing) closer to the mounting table 14.

A swing range of the magnet 22 with respect to each of the targets 20 differs depending on a size of the target 20. For example, as shown by double-headed arrows in FIGS. 3 and 4, the swing range of the magnet 22 with respect to the small target 20 such as the second target $20_2$ is smaller than the swing range of the magnet 22 with respect to the large target 20 such as the first target $20_1$, and specifically, it is about half. Thus, during film formation using the small target 20, it is possible to suppress sputtering of unnecessary portions (for example, the shield 25 and other small target held on the same cathode).

Further, as shown in FIG. 1, a shutter 30 is installed between the cathode $20a$ and the mounting table 14. Specifically, a first shutter 31 and a second shutter 32 are installed between the target 20 held by the cathode $20a$ and the mounting table 14. Each of the first shutter 31 and the second shutter 32 has a shape along a conical surface with the axis AX as a central axis. The second shutter 32 is installed between the first shutter 31 and the mounting table 14.

As shown in FIG. 5, a large opening $31a$ which is an opening having a size corresponding to the large target 20 held by the first and third cathodes $20a_1$ and $20a_3$ is formed in the first shutter 31. Further, as shown in FIG. 1, one end of a rotating shaft 33 is connected to a central portion of the first shutter 31.

As shown in FIG. 6, the second shutter 32 has a large opening $32a$ which is an opening having a size corresponding to the large target 20 held by each of the first and third cathodes $20a_1$ and $20a_3$, and small openings $32b$ and $32c$ which are openings having a size corresponding to the small target 20 held by each of the second and fourth cathodes $20a_2$ and $20a_4$. The small opening $32b$ is an opening for the target 20 on the positive side in the circumferential direction when viewed from the mounting table 14 side out of the two small targets 20 held by the second and fourth cathodes $20a_2$ and $20a_4$. On the other hand, the small opening $32c$ is an opening for the target 20 on the negative side in the circumferential direction when viewed from the mounting table 14 side out of the two small targets 20 held by the second and fourth cathodes $20a_2$ and $20a_4$. In the following, the small opening $32b$ and the small opening $32c$ may be referred to as a small opening $32b$ on the positive side and a small opening $32c$ on the negative side, respectively.

When the position of the large opening $32a$ is set to the 12 o'clock position when viewed from the mounting table 14 side, for example, the position of the small opening $32b$ on the positive side is a position near 3 o'clock, and the position of the small opening $32c$ on the negative side is a position near 6 o'clock.

Openings similar to the large opening $32a$ and the small openings $32b$ and $32c$ may be formed in the first shutter 31, and an opening similar to the large opening $31a$ may be formed in the second shutter 32.

Further, as shown in FIG. 1, one end of the rotating shaft 34 is connected to a central portion of the first shutter 31 while the other end of the rotating shaft 34 is connected to a central portion of the second shutter 32.

The central axis of the rotating shaft 33 and the central axis of the rotating shaft 34 are coaxially installed and substantially coincide with the axis AX. The rotating shaft 33 extends to the outside of the processing container 10, and the other end thereof is connected to the rotating mechanism 35. The rotating mechanism 35 is configured to rotate the rotating shaft 33 and the rotating shaft 34 independently from each other about the axis AX. The rotating mechanism 35 includes a driving part (not shown) including a driving source (for example, a motor or the like) which generates a driving force for rotating the rotating shaft 33 and the rotating shaft 34.

The first shutter 31 rotates around the axis AX as the rotating shaft 33 rotates around the axis AX, and the second shutter 32 rotates around the axis AX as the rotating shaft 34 rotates around the axis AX. By the rotation of the first shutter 31 and the second shutter 32, relative positions of the large opening $32a$, the small opening $32b$, the small opening $32c$, and the target 20 change. Thus, for example, among all the targets 20, only one target 20 is selectively exposed to the mounting table 14 through the openings of the first shutter 31 and the second shutter 32.

Specifically, for example, among all the targets 20, only the first target $20_1$ is exposed to the mounting table 14 through the large opening $31a$ and the large opening $32a$ as shown in FIG. 7, and the other targets 20 are shielded from the mounting table 14 by the first shutter 31 and the second shutter 32.

Further, as shown in FIG. 8, among all the targets 20, only the second target $20_2$ is exposed to the mounting table 14 through the large opening $31a$ and the small opening $32b$ on the positive side, and the other targets 20 are shielded from the mounting table 14 by the first shutter 31 and the second shutter 32.

Further, as shown in FIG. 9, among all the targets 20, only the third target $20_3$ is exposed to the mounting table 14 through the large opening $31a$ and the small opening $32c$ on the negative side, and the other targets 20 are shielded from the mounting table 14 by the first shutter 31 and the second shutter 32.

Further, the film formation apparatus 1 includes a gas supply (not shown) which supplies a gas into the processing container 10. The gas supply includes, for example, a gas source, a flow rate controller such as a mass flow controller, and a gas introduction part. The gas source stores a gas (for example, Ar gas) which is excited in the processing container 10. The gas source is connected to the gas introduction part via the flow rate controller. The gas introduction part is a member which introduces a gas from the gas source into the processing container 10.

When the gas is supplied from the gas supply, and electric power is supplied to the target 20 by the power supply 21, the gas supplied into the processing container 10 is excited.

Further, a magnetic field is generated in the vicinity of a front surface of the target 20 by the magnet 22, and plasma is concentrated in the vicinity of the front surface of the target 20. Then, when positive ions in the plasma collide with the target 20, a substance constituting the target 20 is emitted from the target 20 as sputtered particles. Thus, a desired film is formed on the wafer W.

As shown in FIG. 1, the film formation apparatus 1 further includes a controller U. The controller U is configured of, for example, a computer equipped with a central processing unit (CPU), a memory, and the like, and includes a program storage (not shown). The program storage stores a program which controls the driving part 16b, the driving part of the moving mechanism 23, the driving part of the rotating mechanism 35, and the like and realizes a film forming process described below in the film formation apparatus 1. The program may be recorded on a storage medium which is readable by a computer and may be installed in the controller U from the storage medium. Further, a part or the whole of the program may be realized by dedicated hardware (a circuit board).

<Film Forming Processing>

Next, an example of the film forming process using the film formation apparatus 1 will be described.

(Loading)

First, under the control of the controller U, the wafer W is loaded into the processing container 10 adjusted to a desired pressure. Specifically, the gate valve 13a is opened, and a transport mechanism (not shown) in which the wafer W is held is inserted into the processing container 10 from a transport chamber (not shown) having a vacuum atmosphere adjacent to the processing container 10 via the loading and unloading port 13. Then, the wafer W is transported above the mounting table 14. Next, the wafer W is delivered onto raised support pins (not shown), then the transport mechanism is withdrawn from the processing container 10, and the gate valve 13a is closed. At the same time, the support pins are lowered, and the wafer W is mounted on the mounting table 14 and is attracted and held by an electrostatic absorption force of the electrostatic chuck 14b.

(Multilayer Film Formation)

Subsequently, a multilayer film is formed on the wafer W by magnetron sputtering. Specifically, a film formation using the first target $20_1$, a film formation using the second target $20_2$, a film formation using the third target $20_3$, a film formation using the fourth target $20_4$, a film formation using the fifth target $20_5$, and a film formation using the sixth target $20_6$ are performed on the wafer W. The order of the film formation is arbitrary and predetermined. Further, at least one of the six types of film formations may be performed a plurality of times.

In the film formation using the first target $20_1$, by the rotation of the first shutter 31 and the second shutter 32 by the rotating mechanism 35, only the first target $20_1$ of all the targets 20 is selectively exposed to the mounting table 14 through the large opening 31a and the large opening 32a. Then, the mounting table 14 is rotated by the rotating and moving mechanism 16, and Ar gas, for example, is supplied from the gas supply (not shown) into the processing container 10. Further, electric power is supplied from the power supply 21 to the first target $20_1$. At the same time, the moving mechanism 23 causes the magnet 22 to swing along the first cathode $20a_1$ in the predetermined direction described above. The Ar gas in the processing container 10 is ionized by the electric power from the power supply 21, and electrons generated by the ionization drift by the magnetic field (that is, a leakage magnetic field) formed at the front of the first target $20_1$ by the corresponding magnet 22 to generate high density plasma. The surface of the first target $20_1$ is sputtered by the Ar ions generated in the plasma, and sputtered particles of a constituent material of the first target $20_1$ are deposited on the wafer W to form a layer of the constituent material of the first target $20_1$.

In the film formation using the second target $20_2$, by the rotation of the first shutter 31 and the second shutter 32 by the rotating mechanism 35, only the second target $20_2$ of all the targets 20 is selectively exposed to the mounting table 14 via the large opening 31a and the small opening 32b on the positive side. Then, in this state, as in the case of the film formation using the first target $20_1$, the Ar gas is supplied into the processing container 10, the power is supplied from the power supply 21, the corresponding magnet 22 is swung, and the like. Thus, a layer of the constituent material of the second target $20_2$ is formed. In the film formation using the small second target $20_2$, the swing range of the magnet 22 is set narrower than that in the film formation using the large first target $20_1$.

In the film formation using the third target $20_3$, by the rotation of the first shutter 31 and the second shutter 32 by the rotating mechanism 35, only the third target $20_3$ of all the targets 20 is selectively exposed to the mounting table 14 via the large opening 31a and the small opening 32c on the negative side. Then, in this state, as in the case of film formation using the second target $20_2$, the Ar gas is supplied into the processing container 10, the power is supplied from the power supply 21, and the corresponding magnet 22 is swung, and the like. Thus, a layer of the constituent material of the third target $20_3$ is formed.

In the film formation using the fourth target $20_4$, by the rotation of the first shutter 31 and the second shutter 32 by the rotating mechanism 35, only the fourth target $20_4$ of all the targets 20 is selectively exposed to the mounting table 14 via the large opening 31a and the large opening 32a. Then, in this state, as in the case of the film formation using the first target $20_1$, the Ar gas is supplied into the processing container 10, the power is supplied from the power supply 21, the corresponding magnet 22 is swung, and the like. Thus, a layer of the constituent material of the fourth target $20_4$ is formed.

In the film formation using the fifth target $20_5$, by the rotation of the first shutter 31 and the second shutter 32 by the rotating mechanism 35, only the fifth target $20_5$ of all the targets 20 is selectively exposed to the mounting table 14 via the large opening 31a and the small opening 32b on the positive side. Then, in this state, as in the case of film formation using the second target $20_2$, the Ar gas is supplied into the processing container 10, the power is supplied from the power supply 21, and the corresponding magnet 22 is swung, and the like. Thus, a layer of the constituent material of the fifth target $20_5$ is formed.

In the film formation using the sixth target $20_6$, by the rotation of the first shutter 31 and the second shutter 32 by the rotating mechanism 35, only the sixth target $20_6$ of all the targets 20 is selectively exposed to the mounting table 14 via the large opening 31a and the small opening 32c on the negative side. Then, in this state, as in the case of film formation using the second target $20_2$, the Ar gas is supplied into the processing container 10, the power is supplied from the power supply 21, and the corresponding magnet 22 is swung, and the like. Thus, a layer of the constituent material of the sixth target $20_6$ is formed.

(Unloading)

After that, the wafer W is unloaded from the processing container 10. Specifically, the wafer W is unloaded from the processing container 10 in a reverse operation of the loading operation.

Then, the process returns to the above-described loading operation, and the next wafer W to be filmed is processed in the same manner.

<Effects>

As described above, in the present embodiment, the film formation apparatus 1 includes a plurality of cathodes 20a, and at least one cathode 20a of the plurality of cathodes 20a holds a plurality of types of targets 20. Therefore, according to the present embodiment, various types of targets 20 can be simultaneously mounted in the film formation apparatus 1 without changing the size of the cathode 20a and without increasing the size of the film formation apparatus 1.

Unlike the present embodiment, in the method of reducing the size of the cathode and increasing the number of cathodes, since the apparatus which forms a film by magnetron sputtering requires a magnet and a swing mechanism for the magnet for each of the cathodes, consequently, there is a limit to suppressing the increase in the size of the apparatus.

Further, the configuration of the film formation apparatus 1 according to the present embodiment can be applied to an existing film formation apparatus in which a plurality of cathodes 20a are included and a magnet 22 is installed for each of the cathodes 20a without changing the design of the cathode 20a and the magnet 22. Therefore, in manufacturing the film formation apparatus 1 according to the present embodiment, the review of the film forming conditions and the like can be minimized.

Further, in the present embodiment, the plurality of targets 20 are installed to be arranged in the swing direction of the magnet 22 on the cathode 20a which holds the plurality of targets 20. Unlike the present embodiment, when the plurality of targets 20 are installed to be arranged in a direction orthogonal to the swing direction of the magnet 22, for example, it is necessary to change the design of the magnet 22 such that the plurality of magnets 22 are provided for one cathode 20a. On the other hand, in the present embodiment, it is not necessary to change the design of the magnet 22 as described above. Further, the swing range of the magnet 22 can be adjusted without changing the design of the magnet 22 from the existing one, and it is possible to prevent unnecessary regions from being sputtered when the swing range of the magnet 22 with respect to the small target 20 is adjusted to be small.

Further, since the number of magnets 22 for one cathode 20a may be one, an increase in manufacturing cost can be suppressed.

Further, in the film formation apparatus 1 according to the present embodiment, since the target 20 for forming a thick layer may be large and the target 20 for forming a thin layer may be small, a difference in a lifetime between the targets 20 can be reduced. Therefore, the target for forming a thick layer and the target for forming a thin layer can be replaced at the same time without wasting the target for forming the thin layer. If the targets can be replaced at the same time in this way, a downtime (an operation stoppage period) of the apparatus due to the replacement can be reduced, which is preferable.

<Another Example of Cathode>

Figure 10:
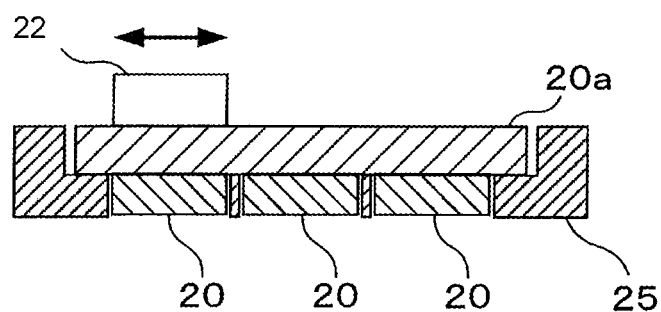
FIG. 10 is a diagram illustrating another example of the cathode.

FIG. 10 is a diagram illustrating another example of the cathode.

In the above example, the number of the targets 20 held by the cathode 20a configured to be capable of holding the plurality of targets 20 is two, but it may be three or more as shown in the drawing.

Also in this example, the shield 25 is installed to cover the entire outer circumference of the plurality of targets 20 held by the cathode 20a and to separate the three targets 20 held by the cathode 20a from each other.

<Other Examples of Shields>

The first shield and the second shield are not limited to the above example.

For example, by making the number and the positions of the openings different from those in the examples of FIGS. 5 and 6, the rotating mechanism may be able to switch between (A) and (B) below by rotating the first shutter and the second shutter.

(A) One target 20 of all the targets held by the plurality of cathodes 20a is selectively exposed to the mounting table 14 through the openings of the first shutter and the second shutter.

(B) Two or more targets 20 of all the targets held by the plurality of cathodes 20a are selectively exposed to the mounting table 14 through the openings of the first shutter and the second shutter.

If the rotating mechanism can switch as described above, a layer of a single material can be formed on the wafer W by selectively exposing one target 20 to the mounting table 14 as in (A), and an alloy layer can be formed on the wafer W by selectively exposing two or more targets to the mounting table 14 as in (B). Therefore, a multilayer film including the alloy layer can be formed on the wafer W.

The embodiments disclosed at this time should be considered to be exemplary in all respects and not restrictive. The above embodiments may be omitted, replaced, or modified in various forms without departing from the scope of the appended claims and their gist.

What is claimed is:

1. A film formation apparatus which forms a film on a substrate by sputtering, the apparatus comprising:
    a substrate holder configured to hold the substrate;
    a plurality of cathodes configured to hold targets that emit sputtered particles;
    a shutter installed between the cathodes and the substrate holder and having an opening; and
    a rotating mechanism configured to rotate the shutter,
    wherein at least one of the plurality of cathodes holds multiple first targets of different materials on a same side of a same cathode of the plurality of cathodes, the multiple first targets being spaced apart from each other, and
    wherein the shutter and the rotating mechanism are configured to selectively expose one target of the multiple first targets on the same side of the same cathode to the substrate holder while the other target(s) of the multiple first targets are covered by the shutter.

2. The film formation apparatus of claim 1, wherein a shield is installed at said at least one of the plurality of cathodes so that the multiple first targets are spaced apart from one another.

3. The film formation apparatus of claim 1, wherein another cathode holds a second target larger than each of the multiple first targets.

4. The film formation apparatus of claim 1,
    wherein the rotating mechanism is configured to selectively expose a specific target of all the targets held by the cathodes in the film formation apparatus to the substrate holder through the opening by rotating the shutter.

5. The film formation apparatus of claim 4, wherein a first shutter and a second shutter, each of which has an opening, are provided as the shutter, and
the rotating mechanism selectively exposes one of all the targets held by the cathodes in the film formation apparatus to the substrate holder through the opening of the first shutter and the opening of the second shutter by rotating the first shutter and the second shutter.

6. The film formation apparatus of claim 5, wherein the rotating mechanism switches between selectively exposing one target of all the targets held by the cathodes in the film formation apparatus to the substrate holder through the openings of the first shutter and the second shutter and selectively exposing two or more of all the targets held by the cathodes in the film formation apparatus to the substrate holder through the openings of the first shutter and the second shutter, by rotating the first shutter and the second shutter.

7. A film formation method which uses a film formation apparatus to form a film on a substrate by sputtering, the film formation apparatus including:
a substrate holder configured to hold the substrate;
a plurality of cathodes configured to hold targets that emit sputtered particles; and
a first shutter and a second shutter installed between the cathodes and the substrate holder and each having a plurality of openings,
wherein at least one of the plurality of cathodes holds multiple targets of different materials on a same side of a same cathode of the plurality of cathodes, the multiple targets being spaced apart from each other, wherein the first and second shutters are configured to selectively expose one target of the multiple first targets on the same side of the same cathode to the substrate holder while the other target(s) of the multiple first targets are covered by at least one of the first and second shutters, the method comprising:
selectively exposing one target of all the targets held by the cathodes in the film formation apparatus to the substrate holder through the openings of the first shutter and the second shutter by rotating the first shutter and the second shutter, and forming a layer of a single material on the substrate; and
selectively exposing two or more of all the targets held by the cathodes in the film formation apparatus to the substrate holder through the openings of the first shutter and the second shutter by rotating the first shutter and the second shutter, and forming an alloy layer on the substrate.

* * * * *